(12) United States Patent
Hunziker et al.

(10) Patent No.: US 10,151,612 B2
(45) Date of Patent: Dec. 11, 2018

(54) FLOW SENSOR PACKAGE

(71) Applicant: Sensirion AG, Stafa (CH)

(72) Inventors: Werner Hunziker, Stafa (CH); Mark Hornung, Stafa (CH); Eric Monnin, Uerikon (CH)

(73) Assignee: Sensirion AG, Stafa (CH)

( * ) Notice: Subject to any disclaimer, the term of this patent is extended or adjusted under 35 U.S.C. 154(b) by 299 days.

(21) Appl. No.: 14/953,914

(22) Filed: Nov. 30, 2015

(65) Prior Publication Data
US 2016/0161314 A1 Jun. 9, 2016

(30) Foreign Application Priority Data
Dec. 8, 2014 (EP) .................................... 14004135

(51) Int. Cl.
*G01F 15/14* (2006.01)
*G01F 1/69* (2006.01)
(Continued)

(52) U.S. Cl.
CPC .............. *G01F 1/688* (2013.01); *G01F 1/684* (2013.01); *G01F 1/6842* (2013.01); *G01F 1/6845* (2013.01); *G01F 1/69* (2013.01); *G01F 15/14* (2013.01); *H01L 21/565* (2013.01); *H01L 21/78* (2013.01); *H01L 23/34* (2013.01); *H01L 23/345* (2013.01); *H01L 23/49541* (2013.01); *H01L 23/49838* (2013.01); *H01L 24/49* (2013.01);
(Continued)

(58) Field of Classification Search
CPC ......... H01L 23/24; H01L 23/54; H01L 24/49; H01L 23/49541; H01L 23/49838; H01L 21/565; H01L 24/85; H01L 21/78; H01L 24/48; H01L 2224/48227; H01L 2224/48247; H01L 2924/146; H01L 2924/1815; H01L 23/3107; H01L 2924/00014; H01L 2224/45099; H01L 2227/45015; H01L 2924/207; G01F 1/688; G01F 1/6842; G01F 1/684; G01F 1/6845; G01F 1/69; G01F 15/14
USPC ...................................................... 73/204.21
See application file for complete search history.

(56) References Cited

U.S. PATENT DOCUMENTS 4,680,673 A * 7/1987 Taverdet ............... H01L 23/473
165/80.4
4,894,707 A 1/1990 Yamawaki et al.
(Continued)

FOREIGN PATENT DOCUMENTS

DE 19959345 * 4/2001
DE 102005043690 3/2007
(Continued)

OTHER PUBLICATIONS

C. Cotofina et al., "Low-cost Plastic Sensor Packaging Using the Open-window Package Concept", Sensors and Actuators A 67, 1998, pp. 185-190.

*Primary Examiner* — J M Saint Surin
(74) *Attorney, Agent, or Firm* — Cooper & Dunham LLP

(57) ABSTRACT

A flow sensor package comprises a chip comprising a sensitive structure for sensing the flow of a fluid and an encapsulation at least partly encapsulating the chip. A recess in the encapsulation contributes to a flow channel for guiding the fluid, which recess exposes at least the sensitive structure of the chip from the encapsulation, and which recess extends beyond an edge of the chip.

19 Claims, 5 Drawing Sheets

(51) Int. Cl.
*G01F 1/684* (2006.01)
*H01L 23/495* (2006.01)
*H01L 21/56* (2006.01)
*H01L 21/78* (2006.01)
*H01L 23/00* (2006.01)
*H01L 23/498* (2006.01)
*H01L 23/34* (2006.01)
*G01F 1/688* (2006.01)
*H01L 23/31* (2006.01)

(52) U.S. Cl.
CPC ......... *H01L 24/85* (2013.01); *H01L 23/3107* (2013.01); *H01L 24/48* (2013.01); *H01L 2224/48227* (2013.01); *H01L 2224/48247* (2013.01); *H01L 2924/00014* (2013.01); *H01L 2924/146* (2013.01); *H01L 2924/1815* (2013.01)

(56) References Cited

U.S. PATENT DOCUMENTS

| | | |
|---|---|---|
| 5,511,428 A | 4/1996 | Goldberg et al. |
| 6,384,353 B1 | 5/2002 | Huang et al. |
| 6,528,875 B1 | 3/2003 | Glenn et al. |
| 6,729,181 B2 | 5/2004 | Mayer et al. |
| 6,964,927 B2 * | 11/2005 | Igel ............... H01L 21/565 257/E21.504 |
| 2001/0023087 A1 | 9/2001 | Brandl |
| 2002/0078744 A1 | 6/2002 | Gehman et al. |
| 2002/0190839 A1 | 12/2002 | Padmanabhan et al. |
| 2004/0171195 A1 | 9/2004 | Raben |
| 2005/0022594 A1 | 2/2005 | Padmanabhan et al. |
| 2005/0104204 A1 | 5/2005 | Kawakubo et al. |
| 2005/0127499 A1 | 6/2005 | Harney et al. |
| 2005/0208701 A1 | 9/2005 | Jeong et al. |
| 2006/0179942 A1 | 8/2006 | Fukaura et al. |
| 2006/0270108 A1 | 11/2006 | Farnworth et al. |
| 2007/0183610 A1 | 8/2007 | Kidmose |
| 2008/0148841 A1 | 6/2008 | Sakai |
| 2008/0264181 A1 * | 10/2008 | Sulouff .............. G01F 1/36 73/861.42 |
| 2008/0283991 A1 | 11/2008 | Reinert |
| 2008/0315230 A1 | 12/2008 | Murayama |
| 2009/0117738 A1 | 5/2009 | Sakaguchi |
| 2009/0212397 A1 | 8/2009 | Tuttle |
| 2010/0035373 A1 | 2/2010 | Hunziker et al. |
| 2010/0225000 A1 | 9/2010 | Sugizaki et al. |
| 2011/0018076 A1 | 1/2011 | Pahl et al. |
| 2012/0001273 A1 | 1/2012 | Chen et al. |
| 2012/0161256 A1 | 6/2012 | Grudin et al. |
| 2012/0212925 A1 | 8/2012 | Zoellin et al. |
| 2013/0094684 A1 | 4/2013 | Ehrenpfordt et al. |
| 2013/0126992 A1 | 5/2013 | Ehrenpfordt et al. |
| 2014/0028340 A1 | 1/2014 | Graf et al. |
| 2015/0143871 A1 | 5/2015 | Huang et al. |
| 2015/0362451 A1 | 12/2015 | Hunziker et al. |

FOREIGN PATENT DOCUMENTS

| | | |
|---|---|---|
| EP | 1211722 | 6/2002 |
| EP | 2273261 | 1/2011 |
| EP | 2482310 | 8/2012 |
| EP | 2693172 | 2/2014 |
| WO | 2006114005 | 11/2006 |
| WO | WO2010102403 * | 9/2010 |
| WO | 2012100360 | 8/2012 |

* cited by examiner c)

a)

b)

c)

FLOW SENSOR PACKAGE

CROSS REFERENCE TO RELATED APPLICATION

This application claims priority of European Patent Application 14004135.1 filed Dec. 8, 2014, the contents of which is incorporated herein by reference in its entirety.

TECHNICAL FIELD

The present disclosure refers to a flow sensor package, a flow sensor arrangement and corresponding methods for manufacturing.

BACKGROUND ART

Flow sensors may be used for measuring flows of any fluid such as liquids or gases. A conventional flow sensor comprises a flow channel open at one side, which opening is covered by a printed circuit board carrying a flow sensor.

DISCLOSURE OF THE INVENTION

The problem to be solved by the present invention is to provide a flow sensor arrangement and components thereof small in size.

This problem is solved by a flow sensor package according to the features of the corresponding independent claim.

The flow sensor package comprises a chip, and preferably a semiconductor chip such as a silicon chip, which is capable of sensing the flow of a fluid. For this purpose, a sensitive structure is preferably arranged at a front side of the chip. The sensitive structure in one embodiment may comprise a thermo-electric arrangement comprising a heater and one or more temperature sensors, e.g. one temperature sensor arranged upstream and another temperature sensor arranged downstream of the heater, such that when a fluid passes this arrangement while the heater being turned on, the flow of the fluid may be derived from a difference in temperatures sensed by the two temperature sensors. However, other sensing concepts may be envisaged, too.

The chip, which is a sensor chip, is at least partially encapsulated. Access to the sensitive structure of the chip is granted by means of a recess in the encapsulation that exposes the sensitive structure of the chip to the environment. As a result, the fluid to be measured can be guided across the sensitive structure. The recess in the encapsulation hence contributes to and at least co-defines a flow channel for guiding the fluid over the sensitive structure. Preferably, a longitudinal extension of the recess exceeds a lateral extension thereof and defines a flow direction of the fluid. Hence, it is preferred that the recess is arranged with respect to the sensitive structure such that the fluid passes a sequence of the heater and the at least one temperature sensor in flow direction such that an alignment of the heater and the temperature sensors coincides with the longitudinal extension of the recess. However, in some scenarios a scale of the chip may be too small for defining a flow channel with a low turbulence characteristic. For this purpose, in a preferred embodiment, the flow channel not only is limited in its longitudinal extension to the dimension of the front side of the chip, but exceeds the front side and reaches into the encapsulation. Hence, the recess preferably extends beyond an edge of the chip, which edge in the above example may be defined by a transition from the front side of the chip to one of its side faces. However, in case the longitudinal extension of the recess and hence the flow channel still is not sufficiently long, it may extend beyond opposite edges of the chip and hence reach into the encapsulation beyond two different edges of the chip. Hence, a strip-shaped bottom of the recess is defined by a first portion formed by the chip and one or two second portions formed by the encapsulation, wherein it is preferred that any transition between these portions is smooth. I.e., the bottom of the recess is flat without showing any steps, gaps, etc. which is preferred for making the fluid flowing laminar in the recess. This is preferably achieved in case the encapsulation is moulded around the chip.

Preferably, the recess exposes a strip of the front side of the chip, wherein it is preferred that the strip represents a portion but not the entire front side of the chip. As a result, the rest of the front side preferably is covered by the encapsulation.

When looking at the flow sensor package and given that the recess is provided in the front side thereof, the recess may either cut through the entire front side between two opposing edges of the flow sensor package, or the recess may terminate prior to reaching the edges of the flow sensor package defined by transitions from its front side to its side faces.

The encapsulation of the chip may be a mould compound that is injection moulded, transfer moulded or otherwise moulded to the chip, and preferably after the chip has been arranged on a carrier. In this case, the encapsulation at least partly encloses the carrier, too. The encapsulation may not only serve for defining the or a part of the flow channel but may also protect the chip and electrical connections between the chip and the carrier, which electrical connections may be bond wires, for example. The carrier may be a printed circuit board, or, in a preferred embodiment, a leadframe comprising a die pad for mounting the chip to, and comprising contact pads that may be electrically isolated from the die pad but in the context of the present disclosure still be considered as part of the carrier. The bond wires may then extend from the front side of the chip down to the carrier and as such be embedded in the encapsulation. Since the bond wires protrude to a certain height from the front side of the chip and the flow channel requires access to the sensitive structure, the encapsulation takes at least two different levels in height.

Preferably, there is an area of the front side of the chip which is also referred to as upper area, from which upper area no bond wires extend. Preferably, the sensitive structure splits the front side of the chip into the upper area and a lower area, e.g. along the longitudinal extension of the chip. The lower area correspondingly may contain all the bond wires extending from the chip. As a result, the encapsulation may reach close to the chip around the upper area. In case electronic circuitry is integrated into the chip, it is preferably integrated into the lower area. In this way, the electronic circuitry may be connected to the outside world by means of the bond wires residing in the same area. The electronic circuitry may preferably be used for processing signals from the sensitive structure. As a result, it is preferred that the lower area exceeds the upper area in size.

Mapping this approach to the dimensions of the flow sensor package, the recess divides the flow sensor package into an upper volume and a lower volume, wherein the bond wires are exclusively embedded in the encapsulation in the lower volume. In terms of a small overall size of the flow sensor package, it is preferred to arrange the recess off-centred. Correspondingly, the lower volume exceeds the upper volume in space. In case the carrier comprises contact pads that are arranged at the circumference of the chip and assuming that no redistribution is performed by the carrier, the contact pads in the upper volume are dummy contact pads not serving any of signal, clock or power supply.

In a different embodiment, however, the lower and the upper area may be equal in size with a tolerance of 20%. Accordingly, the upper and the lower volume may be equal in size with a tolerance of 20%. In this embodiment, bond wires may be arranged in both areas and volumes respectively.

The flow sensor package according to any one of the previous embodiments may be operated as such, or may be complemented by a lid for defining the flow channel together with the recess in the flow sensor package. A combination of the flow sensor package and the flow channel lid is referred to as flow sensor arrangement. Accordingly, such flow channel lid comprises a cover with a front side and a back side. When such flow channel lid is mounted with its back side onto the front side of the flow sensor package, the cover and the recess define the flow channel for guiding the fluid. In an embodiment, the cover comprises a protrusion extending from its back side which may reach into the recess of the flow sensor package for building the flow channel between the protrusion and the encapsulation. Preferably, a height of the protrusion is less than a depth of the recess such that when being assembled a gap is generated between the protrusion and the recess which gap represents the flow channel. In a preferred embodiment, a longitudinal extension of the protrusion is less than the longitudinal extension of the recess, such that the fluid may be guided into the flow channel through bores in the cover. For this purpose, an inlet tube and an outlet tube may preferably be provided for connecting to the flow channel which tubes preferably extend from the front side of the cover. At least one of the inlet tube and the outlet tube, and preferably both the inlet tube and the outlet tube, comprise/s a flow resistance, preferably embodied as a reduction of an inner diameter of the respective tube.

In a preferred embodiment, the cover exceeds the front side of the flow sensor package in size, and pins extend from the back side of the cover, and specifically from its corners. When assembling the flow channel lid and the flow sensor package, the flow sensor package can be received by a cavity defined by the back side of the flow channel lid and its pins. In addition, each pin has a length computed from a level of the back side of the cover that exceeds a height of the flow sensor package such that when the flow sensor package is assembled with the flow channel lid, the pins exceed the back side of the flow channel package and may be used for alignment purposes in combination with corresponding bores in a support the entire flow sensor arrangement may be placed on.

In particular, one or more, and preferably all of the cover, the inlet tube, the outlet tube and the pins are manufactured as one piece.

According to another aspect of the present invention, a method is provided for manufacturing a flow sensor package. First, a chip is manufactured, preferably from a wafer that is separated after manufacture into individual chips by dicing. The wafer may be processed for generating electronic circuitry and the sensitive structure, and additionally a recess in the wafer underneath each sensitive structure for building a membrane that thermally isolates the sensitive structure residing on the membrane.

Preferably, after dicing the wafer each individual chip is placed on a carrier such as a leadframe and bond wires are applied for electrically connecting the chip to the carrier.

Such chip/carrier combination may then be placed in a mould comprising a protrusion that rests on a front side of the chip for building the recess. Therefore, the protrusion of the mould covers the sensitive structure and preferably reaches beyond an edge of the chip.

In a preferred embodiment, multiple individual chips may be attached to a structure comprising multiple carriers that are mechanically interconnected, e.g. in form of a large leadframe. Then, bond wires are applied between each individual chip and the corresponding portion of the structure while all the chips rest together on the structure.

In this embodiment, the mould may comprise multiple protrusions for forming a recess in the encapsulation of each of the chips. It is preferred that no other protrusion is provided in the mould, e.g. for separating encapsulations of individual chips from each other. Therefore, when the mould is filled with a mould compound, an encapsulation block is generated having a common surface across all future flow sensor packages. Hence, individual flow sensor packages will be generated by sawing through the encapsulation block and the structure/leadframe, such that side faces of the flow sensor packages will be generated by sawing rather than being defined by the mould.

It is preferred that a flow sensor arrangement comprising a flow sensor package attached to a flow channel lid is calibrated after having attached the flow channel lid to the flow sensor package. Any stress or other impact resulting from the attachment of the flow channel lid to the flow sensor package can hence be taken into account in the calibration parameters and may make further calibration steps obsolete.

Other advantageous embodiments are listed in the dependent claims as well as in the description below.

BRIEF DESCRIPTION OF THE DRAWINGS

The aspects defined above and further aspects, features and advantages of the present invention can also be derived from the examples of embodiments to be described hereinafter. Such description makes reference to the annexed drawings, wherein.

MODES FOR CARRYING OUT THE INVENTION

Figure 1:
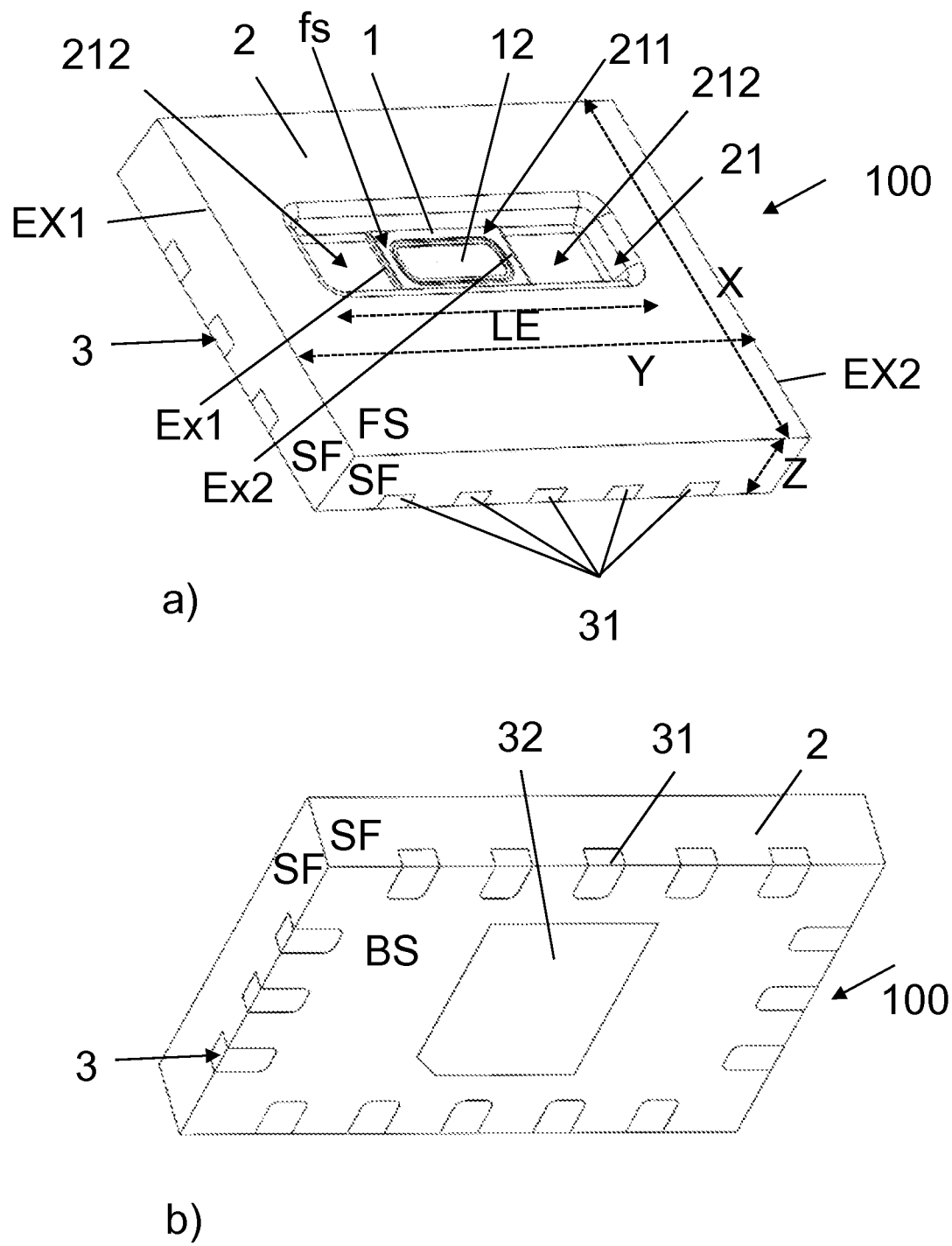
FIG. 1 illustrates a flow sensor arrangement according to an embodiment of the present invention in three different views.

Similar or relating components in the several figures are provided with the same reference numerals.

FIG. 1 illustrates a flow sensor package according to an embodiment of the present invention. The flow sensor package 100 is shown in diagram 1a) in a perspective view onto its front side FS, in diagram 1b) in a perspective view onto its back side BS, and in diagram 1c) in a transparent perspective view onto its front side FS.

The flow sensor package 100 is of rectangular shape which is mainly defined by an encapsulation 2 made, for example, from a mould compound which is applied in a moulding process. The flow sensor package 100 has a longitudinal extension X, a lateral extension Y and a height Z which define the front side FS, the back side BS, and four side faces SF.

A recess 21 of longitudinal extension LE is provided in the flow sensor package 100 in parallel to its lateral extension Y. The recess 21 has a strip like shape and exposes a portion of a chip 1 otherwise enclosed by the encapsulation 2. This portion of the chip 1 is referred to as first portion 211. Two other portions 212 of a bottom of the recess 21 are defined by encapsulation material which together with the first portion 211 define a preferably plane bottom of the recess 21 for avoiding turbulences in the fluid to be measured. The recess 21 presently does not extend across the entire lateral extension Y of the flow sensor package 100, but terminates prior to reaching edges EX1 and EX2 which are defined as transitions between the front side FS and two opposing side faces SF. However, in another embodiment, the recess 21 may fully extend across the lateral extension Y of the flow sensor package 100 between the edges EX1 and EX2. However, in any of these embodiments, the recess at least extends one edge Ex1, Ex2 of the chip 1 given that a flow channel that exceeds at least half of the lateral extension y of the chip 1 is preferred for avoiding turbulences in the fluid.

In the first portion 211 of the bottom of the recess 21, a structure 12 sensitive to the flow of a fluid is exposed, which sensitive structure 12 is arranged on a front side fs of the chip 1 only a part of which is visible in the recess 21. The recess 21 thereby exceeds beyond two opposing edges Ex1 and Ex2 of the chip 1 which are defined by the transitions from the front side fs to two side faces (not visible in FIG. 1).

The chip 1 is arranged on a carrier 3, only contact pads 31 of which carrier 3 are exposed from side faces SF of the encapsulation 2 in diagram 1a), and which contact pads 31 and a die pad 32 are exposed from the encapsulation 2 on the back side BS in diagram 1b). The die pad 32 preferably serves as plate carrying the chip 1 and transporting heat away from the chip 1 during operation. The contact pads 31 are presently arranged along all four bottom edges of the flow sensor package 1, and each contact pad 31 is exposed from the back side BS of the flow sensor package 100 as well as from one of its side faces SF. At least some of contact pads 31 serve for contacting the flow sensor package 1 from the outside.

In the transparent view of diagram 1c), the chip 1 can be seen in more detail: The chip 1 has a longitudinal extension x and a lateral extension y, and is of cuboid shape. The longitudinal extension x exceeds its lateral extension y, and the sensitive structure 12 is arranged asymmetrically with respect to the centre of gravity of the chip 1. The sensitive structure 12 specifically is arranged at longitudinal position x1, which coincides with longitudinal position X1 of the recess 21 in the flow sensor package 100. Hence, the longitudinal position x1 of the sensitive structure 12 separates the front side fs of the chip 1 into an upper area UA and a lower area LA which lower area LA exceeds the upper area UA in size. This arrangement is preferred and owed to the presence of electronic circuitry integrated in the lower area LA of the chip 1. Given that the chip 1 preferably contains a semiconductor substrate, and specifically a silicon substrate, the electronic circuitry may be provided for processing a signal supplied by the sensitive structure 12. For electrically connecting the electronic circuitry and/or the sensitive structure 12 to the outside world, bond wires 4 are provided, only one of which is shown in diagram 1c) for illustration purposes. Given that the bond wires 4 reach from the front side fs of the chip 1 down to the carrier 3 where electrical connections are provided towards the contact pads 31, the bond wires 4 require a certain height of the encapsulation 2 above the front side fs of the chip 1 for the embedding. On the other hand, the sensitive structure 12 requires exposure from the encapsulation 2 by means of the recess 21 in view that the recess 21 at least co-defines a flow channel for the fluid to be measured. This leads to the encapsulation 2 serving both the protection of the bond wires 4 and the definition of the flow channel at the same time.

Since the sensitive structure 12 is arranged out of the centre of gravity of the chip 1, sufficient chip surface is provided in the lower area LA for the electronic circuitry. Preferably, bond pads from which the bond wires 4 can be bonded down to the carrier 3 are also provided in the lower area LA of the front side fs of the chip 1. It is preferred, that the electronic circuitry and the bond pads are exclusively arranged in the lower area, such that bond wires 4 exclusively extend from the lower area LA of the chip 1. This arrangement provides for a small and compact size of the overall flow sensor package 100.

The longitudinal position X1 of the recess 21 in the flow sensor package 100 virtually separates its volume into an upper volume UV and a lower volume, wherein only the lower volume LV contains the encapsulated bond wires 4. Under the assumption that according to the embodiment shown in FIG. 1 the contact pads 31 are arranged at all four edges of the back side BS of the flow sensor package 100, contact pads arranged in the upper volume UV of the flow sensor package 100 are dummy contact pads 31 and do not carry any signal.

Figure 2:
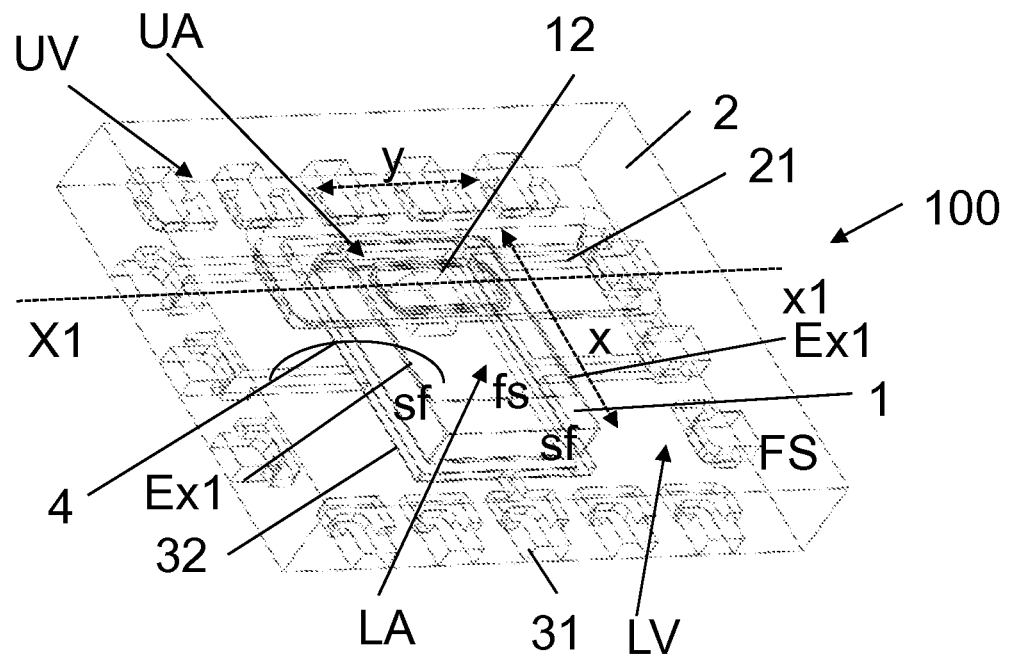
FIG. 2 illustrates a flow channel lid according to an embodiment of the present invention in three different views.
Figure 2:
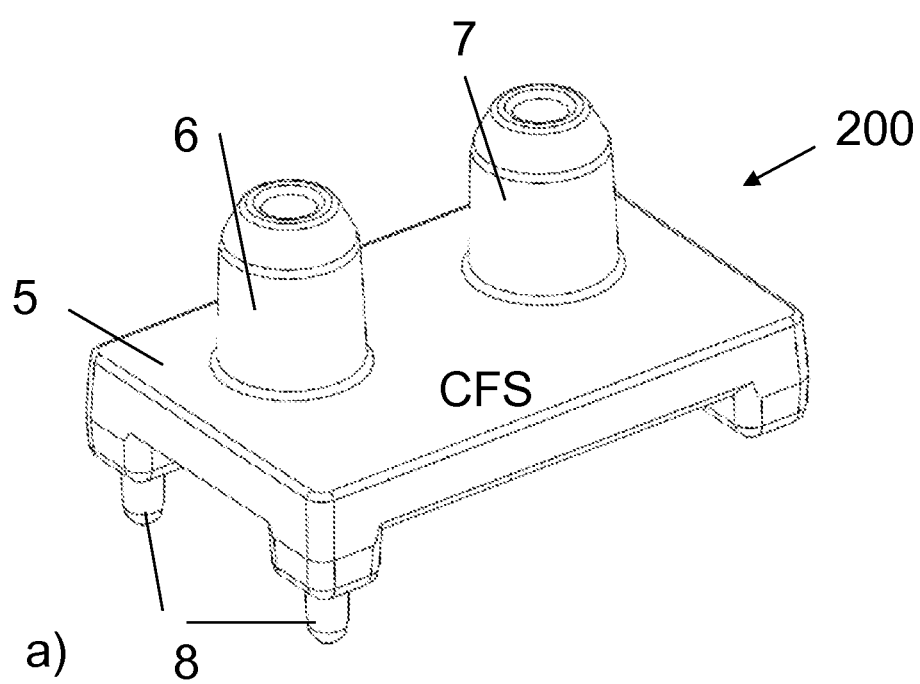
Figure 2:
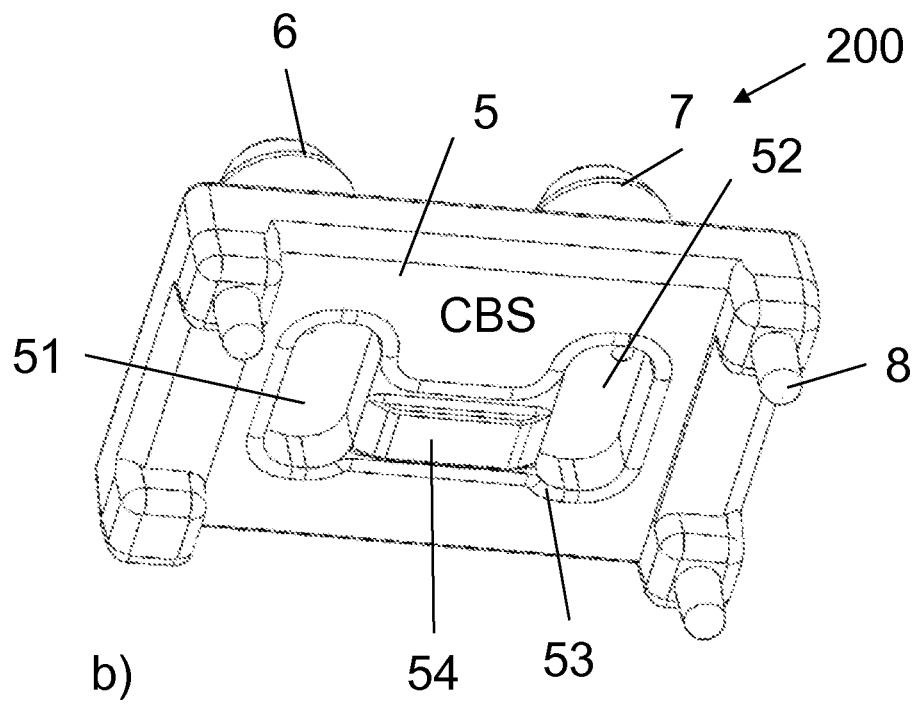
Figure 2:
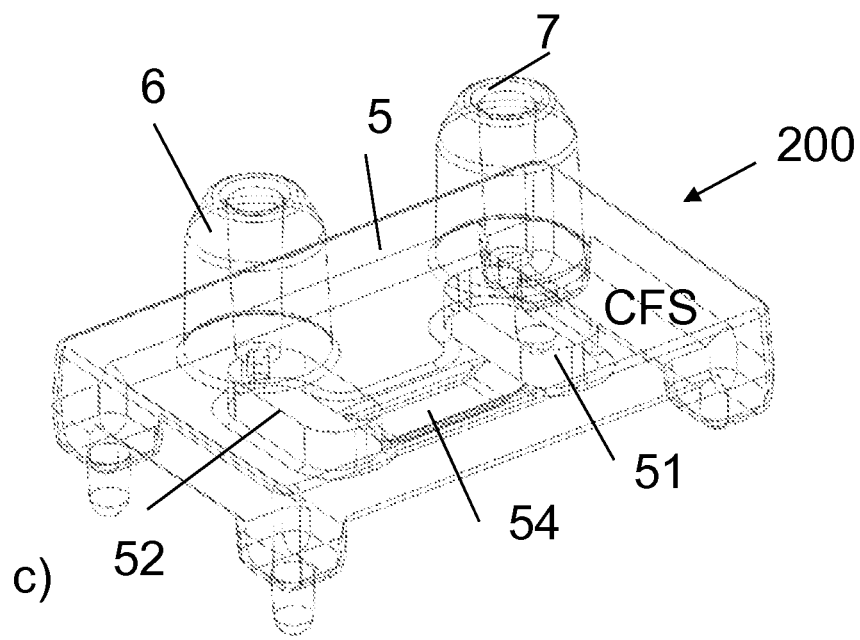

FIG. 2 illustrates a flow channel lid according to an embodiment of the present invention. The flow channel lid 200 is shown in diagram 2a) in a perspective view onto its front side CFS, in diagram 2b) in a perspective view onto its back side CBS, and in diagram 2c) in a transparent perspective view onto its front side FS. In one embodiment of the present invention, the front channel lid 200 is attached to a flow sensor package 100 as provided according to FIG. 1 for building a flow sensor arrangement in which a flow channel is defined, as will be shown more specifically with respect to FIG. 3.

The flow channel lid 200 comprises a cover 5 with a front side CFS and a back side CBS, preferably of a rather flat and rectangular shape, the size of which cover 5 preferably exceeds the size of the flow sensor package 100. An inlet tube 6 and an outlet tube 7 protrude from the front side CFS of the flow channel lid 200, preferably in a direction orthogonal to its front side CFS. The tubes 6 and 7 are meant to supply and remove fluid to be measured to and from the flow channel which flow channel will be co-defined by the flow channel lid, and in particular by a protrusion 54 arranged at the backside BS of the flow channel lid 200 as is shown in diagram 2b). From the diagram 2b), it is also derived that the tubes 6 and 7 end up in cavities 51 and 52 on the back side BS of the flow channel lid 200. These cavities 51 and 52 serve for enhancing the volume of the flow channel in order to reduce turbulences. In addition, a sealing lip 53 is provided at the back side CBS of the cover 5 encircling the cavities 51 and 52 and the protrusion 54, and as such encircling the flow channel to be built.

One or more pins 8 are provided and protrude from the back side CBS of the support 5 orthogonal to it. Presently, there are three pins 8 provided, each in a corner of the support 5. These pins 8 are meant to embrace the flow sensor package when being introduced into the flow channel lid 200, and additionally may serve as aligning means as will be explained later on.

The inlet and the outlet tube 6 and 7, the pins 8 and the support 5 are preferably made from one piece of material which may be moulded or 3D printed, and which material preferably is plastics.

Figure 3:
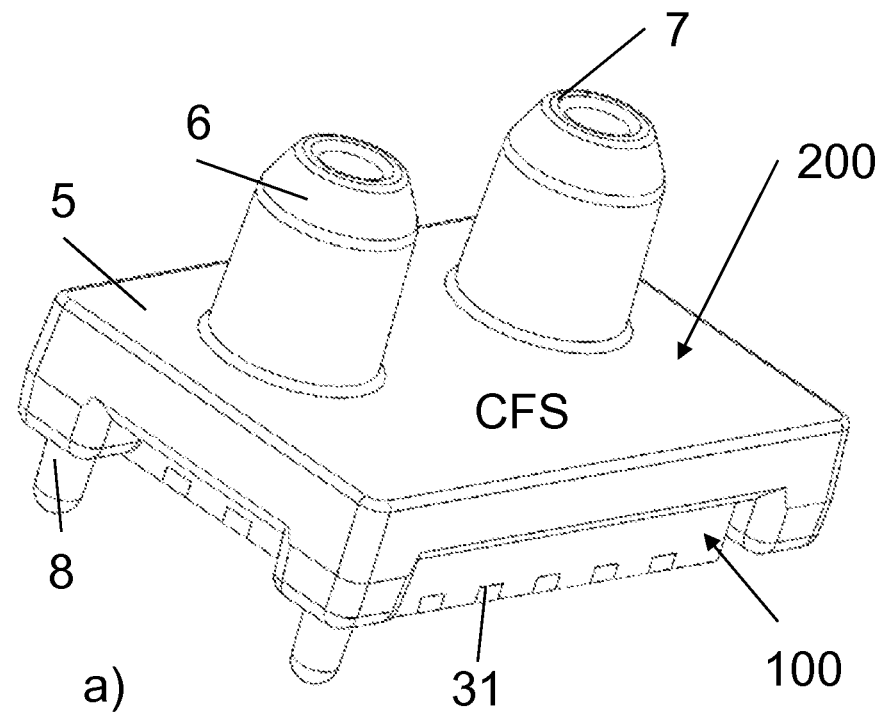
FIG. 3 illustrates a flow sensor arrangement according to an embodiment of the present invention in three different views.
Figure 3:
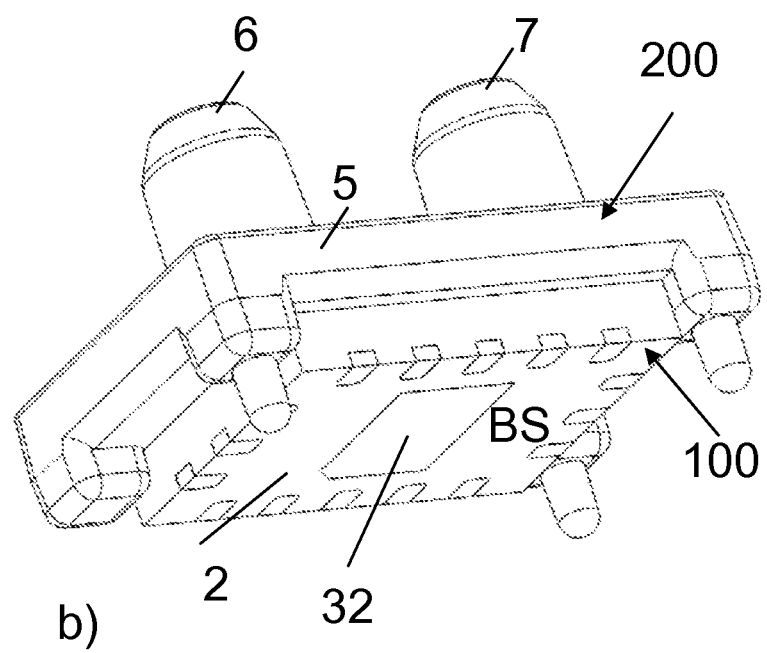
Figure 3:
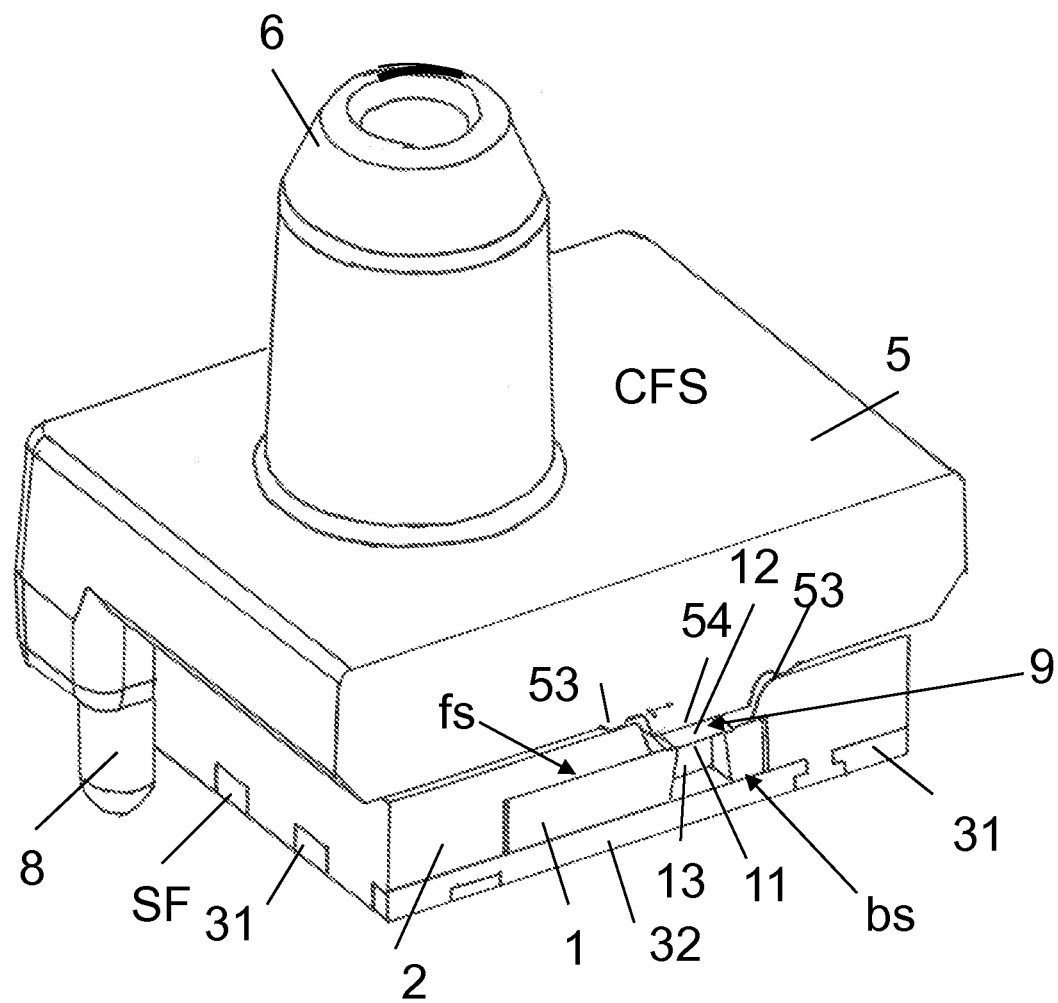

FIG. 3 finally illustrates a flow sensor arrangement according to an embodiment of the present invention comprising a flow sensor package 100 as shown in FIG. 1 and a flow channel lid 200 according to FIG. 2 in assembly. The flow sensor arrangement is shown in diagram 3a) in a perspective view onto the front side CFS of the flow channel lid 200, and in diagram 3b) in a perspective view onto the back side BS of the flow sensor package 100. Diagram 3c) shows a vertical cut of the flow sensor arrangement between the inlet and the outlet tube 6 and 7 in a perspective view onto the front side CFS of the flow channel lid 200.

Since the plane extension of the flow sensor package 100 is smaller than the one of the flow channel lid 200, the flow sensor package 100 can be mounted in a cavity like space at the backside CBS of the flow channel lid 200 which space is co-defined by the pins 8. Preferably, the backside CBS of the flow channel lid 200 is glued to the front side FS of the flow sensor package 100 with the protrusion 54 of the flow channel lid 200 reaching into the recess 21 of the flow sensor package 100. The side faces sf of the flow sensor package 100 to a large extent remain visible, i.e. uncovered by the cover 5 or the pins 8. Therefore, solder connections between the contact pads 31 and an external carrier can be visually inspected.

As can be derived from diagram 3c), the protrusion 54 is dimensioned to not fully reach down to the bottom of the recess 21 manufactured in the front side fs of the chip 1, such that a gap between the protrusion 54 and the front side fs of the chip 1 defines the flow channel 9. The flow channel 9 extends across a portion of the chip 1 containing the sensitive structure 12, and across a portion of the encapsulation 2 of the flow sensor package 100 (not visible in diagram 3c). The sealing lip 53 of the flow channel lid 200 rests on the encapsulation 2 such that the entire flow channel 9 and the cavities 51 and 52 (not visible) are sealed.

The sensitive structure 12 is arranged on a membrane 11 of the chip 1 for thermal insulation purposes. Under the assumption that the chip 1 contains a substrate, the substrate is removed underneath the sensitive structure 12, e.g. by etching, such that by building a cavity 13 in this way the membrane 11 spans the cavity 13.

The chip 1 sits on the die pad 32 of the carrier, which die pad 32 may be connected to one or more of the contact pads 31 for grounding purposes.

The flow sensor arrangement can be placed onto a support, such as a printed circuit board (PCB), with the back side BS of the flow sensor package 100 facing the PCB. The contact pads 31 may be soldered to corresponding contact pads of the PCB while the pins 8 serve as alignment means for placing the flow sensor arrangement on the desired area of the PCB. The pins 8 thereby are placed in bores of the PCB. The only three pins 8 thereby serve as a mechanical coding for preventing from a rotated arrangement of the flow sensor arrangement.

In the present application, the term "fluid" includes all media capable of flowing along a flow channel such as gases, liquids, etc.

The invention claimed is:

1. Flow sensor package, comprising
a chip comprising a sensitive structure for sensing the flow of a fluid,
an encapsulation at least partly encapsulating the chip, and
a recess in the encapsulation contributing to a flow channel for guiding the fluid, which recess exposes at least the sensitive structure of the chip from the encapsulation,
wherein the chip has a front side and side faces,
wherein the sensitive structure is arranged at the front side of the chip,
wherein the recess exposes a strip of the front side of the chip from the encapsulation including the sensitive structure,
wherein a transition between the front side of the chip and one of its side faces defines an edge of the chip the recess extends beyond,
wherein a bottom of the recess comprises a first portion formed by the front side of the chip and at least one second portion formed by the encapsulation,
wherein the first portion and the at least one second portion are arranged at the same level.

2. Flow sensor package according to claim 1,
wherein the sensitive structure comprises a heater and at least one temperature sensor next to the heater,
wherein the recess has a longitudinal extension exceeding its lateral extension which longitudinal extension defines a flow direction for the fluid, and
wherein the recess is arranged with respect to the sensitive structure such that the fluid passes a sequence of the heater and the at least one temperature sensor in flow direction.

3. Flow sensor package according to claim 1, comprising a carrier for the chip,
wherein the chip is electrically connected to the carrier by means of bond wires,
wherein the bond wires are embedded in the encapsulation.

4. Flow sensor package according to claim 3,
wherein a front side of the chip at which the sensitive structure is arranged has a longitudinal extension and a lateral extension,
wherein a longitudinal position of the sensitive structure separates the front side of the chip in an upper area and a lower area,
wherein the upper area is smaller than the lower area,
wherein the bond wires exclusively extend from the lower area, and
in particular wherein the chip is a semiconductor chip and electronic circuitry is integrated into the lower area for processing a signal supplied by the sensitive structure.

5. Flow sensor package according to claim 4,
wherein the longitudinal extension of the front side of the chip exceeds its lateral extension, and
wherein the recess extends across the front side of the chip in parallel to its lateral extension.

6. Flow sensor package according to claim 3,
wherein the flow sensor package has a cuboid shape with a longitudinal extension, a lateral extension and a height, the longitudinal extension and the lateral extension defining a front side of the flow sensor package the recess is arranged in,
wherein the recess extends in parallel to the lateral extension of the flow sensor package,
wherein a longitudinal position of the recess separates a volume of the flow sensor package in an upper volume and a lower volume, wherein the upper volume is smaller than the lower volume, wherein the bond wires are exclusively arranged in the lower volume.

7. Flow sensor package according to claim 6, wherein the carrier comprises contact pads for electrically connecting the flow sensor package from the outside, which contact pads are exposed from the encapsulation at one or more of a back side of the flow sensor package opposite its front side and/or at side faces of the flow sensor package, and wherein the contact pads located in the upper volume are dummy contact pads.

8. Flow sensor package according to claim 1, wherein the recess extends beyond opposite edges of the chip.

9. Flow sensor package according to claim 1, wherein the flow sensor package has a front side and side faces defined by the encapsulation, wherein the recess is arranged in the front side of the flow sensor package, wherein a transition between the front side and each side face defines an edge of the flow sensor package.

10. Flow sensor package according to claim 9, wherein the recess extends completely across the flow sensor package between opposite edges thereof.

11. Flow sensor package according to claim 9, wherein a longitudinal extension of the recess terminates prior to reaching opposite edges of the flow sensor package.

12. Flow sensor arrangement comprising, a flow sensor package according to claim 1, and a flow channel lid comprising a cover, which cover at least partly covers the recess in the encapsulation for defining the flow channel for guiding a fluid.

13. Flow sensor arrangement according to claim 12, comprising, a protrusion extending from a back side of the cover, wherein the protrusion extends into the recess of the flow sensor package for forming the flow channel between the protrusion and the flow sensor package.

14. Flow sensor arrangement according to claim 12, wherein the cover exceeds a front side of the flow sensor package to be mounted to in size, and in particular wherein the cover is of rectangular shape.

15. Flow sensor arrangement according to claim 14, wherein the flow channel lid comprises pins extending from the back side of the cover for embracing the flow sensor package, and in particular wherein the pins extend from corners of the cover, and in particular wherein the pins are manufactured as one piece together with the cover.

16. Flow sensor arrangement according to claim 15, wherein each pin has a length computed from the back side of the cover that exceeds a height of the flow sensor package.

17. Flow sensor arrangement according to claim 12, wherein the flow channel lid comprises an inlet tube and an outlet tube for the flow channel, and in particular wherein the inlet tube and the outlet tube extend from a front side of the cover, and in particular wherein the inlet tube and the outlet tube are manufactured as one piece together with the cover.

18. Flow sensor arrangement according to claim 17, wherein at least one of the inlet tube and the outlet tube, and preferably both the inlet tube and the outlet tube, comprise/s a flow resistance, and in particular wherein the flow resistance is embodied as a reduction of an inner diameter of the respective tube.

19. Flow sensor arrangement according to claim 12, wherein the flow channel lid is glued with its back side to the front side of the flow sensor package.

* * * * *